US011450719B2

(12) United States Patent
Chang et al.

(10) Patent No.: US 11,450,719 B2
(45) Date of Patent: Sep. 20, 2022

(54) ORGANIC LIGHT-EMITTING PANEL AND FABRICATION METHOD THEREOF

(71) Applicant: Au Optronics Corporation, Hsinchu (TW)

(72) Inventors: Kuo-Jui Chang, Hsinchu (TW); Chien-Sen Weng, Hsinchu (TW); Ming-Wei Sun, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 73 days.

(21) Appl. No.: 17/020,857

(22) Filed: Sep. 15, 2020

(65) Prior Publication Data

US 2021/0399066 A1 Dec. 23, 2021

(30) Foreign Application Priority Data

Jun. 22, 2020 (TW) ................................. 109121050

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3258* (2013.01); *H01L 51/5271* (2013.01); *H01L 51/56* (2013.01); *H01L 2227/323* (2013.01)

(58) Field of Classification Search
CPC ............. H01L 27/3246; H01L 27/3258; H01L 51/5271; H01L 51/56; H01L 2227/323
USPC ......................................................... 257/40
See application file for complete search history.

(56) References Cited

U.S. PATENT DOCUMENTS

| 7,701,132 | B2 | 4/2010 | Oh | |
|---|---|---|---|---|
| 9,865,839 | B2 | 1/2018 | Saito et al. | |
| 10,305,065 | B2 | 5/2019 | Saito et al. | |
| 10,476,031 | B2 | 11/2019 | Saito et al. | |
| 2006/0006424 | A1* | 1/2006 | Yamazaki | H01L 29/78621 257/E27.111 |
| 2006/0113900 | A1 | 6/2006 | Oh | |
| 2013/0256638 | A1* | 10/2013 | Uesugi | H01L 51/0023 438/34 |
| 2015/0076476 | A1* | 3/2015 | Odaka | H01L 51/5203 438/33 |

(Continued)

FOREIGN PATENT DOCUMENTS

| CN | 1790668 | 6/2006 |
|---|---|---|
| CN | 1825614 | 8/2006 |

(Continued)

*Primary Examiner* — Dzung Tran
(74) *Attorney, Agent, or Firm* — JCIPRNET

(57) ABSTRACT

An organic light-emitting panel, including a substrate, a planarization layer, a reflective layer and a bank layer, is provided. The substrate has a display region and a periphery region beside the display region. The planarization layer is disposed on the substrate and has an indentation. The reflective layer is disposed on the planarization layer. The reflective layer is formed along a sidewall of the indentation. The bank layer is disposed on the planarization layer, covers the indentation, and has a periphery taper surface. The indentation is adjacent to the periphery taper surface and is closer to the display region than the periphery taper surface. A fabrication method of the above organic light-emitting panel is also provided.

10 Claims, 6 Drawing Sheets

(56) References Cited

U.S. PATENT DOCUMENTS

| | | | |
|---|---|---|---|
| 2015/0207100 A1* | 7/2015 | Saito | H01L 51/5246 |
| | | | 257/40 |
| 2016/0079325 A1* | 3/2016 | Lee | H01L 27/3246 |
| | | | 438/26 |
| 2016/0181350 A1* | 6/2016 | Lee | H01L 51/5212 |
| | | | 438/34 |
| 2016/0233289 A1* | 8/2016 | Son | H01L 27/3258 |
| 2016/0233451 A1* | 8/2016 | Choi | H01L 27/3246 |
| 2018/0083223 A1 | 3/2018 | Saito et al. | |
| 2018/0166518 A1* | 6/2018 | Kim | H01L 27/3276 |
| 2019/0221772 A1 | 7/2019 | Saito et al. | |
| 2020/0013988 A1 | 1/2020 | Saito et al. | |

FOREIGN PATENT DOCUMENTS

| | | |
|---|---|---|
| CN | 109904197 | 6/2019 |
| TW | 201405804 | 2/2014 |

* cited by examiner

ORGANIC LIGHT-EMITTING PANEL AND FABRICATION METHOD THEREOF

CROSS-REFERENCE TO RELATED APPLICATION

This application claims the priority benefit of Taiwan application serial no. 109121050, filed on Jun. 22, 2020. The entirety of the abovementioned patent application is hereby incorporated by reference herein and made a part of this specification.

BACKGROUND

Technical Field

This disclosure relates to an electronic device, and in particular to an organic light-emitting panel.

Description of Related Art

An organic light-emitting panel uses an organic light-emitting material as a light-emitting layer, which has good display effects such as high brightness, high luminous efficiency, and high contrast. In general, the organic light-emitting material may be fabricated on a substrate by methods such as evaporation or inkjet. The inkjet fabrication method is more efficient. However, using the inkjet method to fabricate the organic light-emitting material on the substrate may cause other issues, and therefore the organic light-emitting panel still needs to be improved.

SUMMARY

The disclosure provides a good quality organic light-emitting panel.

The disclosure also provides an organic light-emitting panel, which can improve the yield rate of the organic light-emitting panel under the same fabrication process.

The organic light-emitting panel of the disclosure includes a substrate, a planarization layer, a reflective layer, and a bank layer. The substrate has a display region, and a periphery region beside the display region. The planarization layer is disposed on the substrate, and has an indentation. The reflective layer is disposed on the planarization layer. The reflective layer is formed along a sidewall of the indentation. The bank layer is disposed on the planarization layer. The bank layer covers the indentation, and has a periphery taper surface located in the periphery region. The indentation is adjacent to the periphery taper surface, and is closer to the display region than the periphery taper surface.

In an embodiment of the disclosure, the bank layer further has a display region taper surface located in the display region. The display region taper surface surrounds to form a pixel region opening, and the periphery taper surface is more gradual than the display region taper surface.

In an embodiment of the disclosure, the organic light-emitting panel further includes an organic light-emitting layer. The organic light-emitting layer is disposed in the pixel region opening and surrounded by the display region taper surface.

In an embodiment of the disclosure, an angle of inclination of the periphery taper surface is from 20 degrees to 60 degrees.

In an embodiment of the disclosure, a horizontal distance from the center of the indentation to a base edge of the periphery taper surface is from 7 micrometers ($\mu m$) to 15 $\mu m$.

In an embodiment of the disclosure, a recess depth of the indentation recessed from the top surface of the planarization layer toward the substrate is from 1 $\mu m$ to 6 $\mu m$.

In an embodiment of the disclosure, the indentation includes multiple dot-shaped indentations distributed along the periphery taper surface or a long strip-shaped indentation distributed along the periphery taper surface.

In an embodiment of the disclosure, a horizontal width of the base of the indentation is from 4 $\mu m$ to 12 $\mu m$.

In an embodiment of the disclosure, the reflective layer includes a metal reflective layer.

In an embodiment of the disclosure, the organic light-emitting panel further includes an electrode layer. The electrode layer continuously extends from the display region to the periphery region to cover the periphery taper surface, and extends beyond the periphery taper surface.

In an embodiment of the disclosure, the reflective layer includes a reflective portion, and a transmission portion connected to the reflective portion. The reflective portion covers the indentation, and the transmission portion extends beyond the bank layer to allow the electrode layer to be connected to the transmission portion.

A fabrication method of the organic light-emitting panel of the disclosure includes the following steps, but not limited thereto. A planarization layer is formed on a substrate, and the planarization layer has an indentation. A reflective layer is formed on the planarization layer, so that the reflective layer is formed along a sidewall of the indentation to form a reflective taper surface. A photosensitive material layer is formed on the planarization layer. The photosensitive material layer is patterned into a bank layer using a photomask. The photosensitive material layer corresponding to a first region and a second region of the photomask are removed to form a periphery taper surface and a display region taper surface of the bank layer. The periphery taper surface is adjacent to the indentation. The photomask has the same light transmittance in the first region and the second region, and the periphery taper surface is more gradual than the display region taper surface.

In an embodiment of the disclosure, the photosensitive material layer has negative photosensitive properties.

In an embodiment of the disclosure, the first region and the second region of the photomask are light-shielding regions.

In an embodiment of the disclosure, the fabrication method further includes forming an electrode layer on the bank layer. The electrode layer continuously covers the periphery taper surface and the display region taper surface.

In an embodiment of the disclosure, the reflective layer includes a transmission portion. The transmission portion extends from the indentation to the periphery taper surface, and extends beyond the periphery taper surface to allow the electrode layer to be connected to the transmission portion.

In an embodiment of the disclosure, the display region taper surface surrounds to form a pixel region opening, and the fabrication method further includes forming an organic light-emitting layer in the pixel region opening.

Based on the above, the organic light-emitting display panel according to an embodiment of the disclosure is provided with the indentation in the planarization layer, the indentation corresponds to the periphery taper surface of the bank layer, and the sidewall of the indentation is covered by the reflective layer. Thus, the periphery taper surface of the bank layer fabricated by lithography has a gradual slope, which helps to ensure the continuity of subsequent film layers on the periphery taper surface, thereby improving the yield rate of the organic light-emitting panel.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
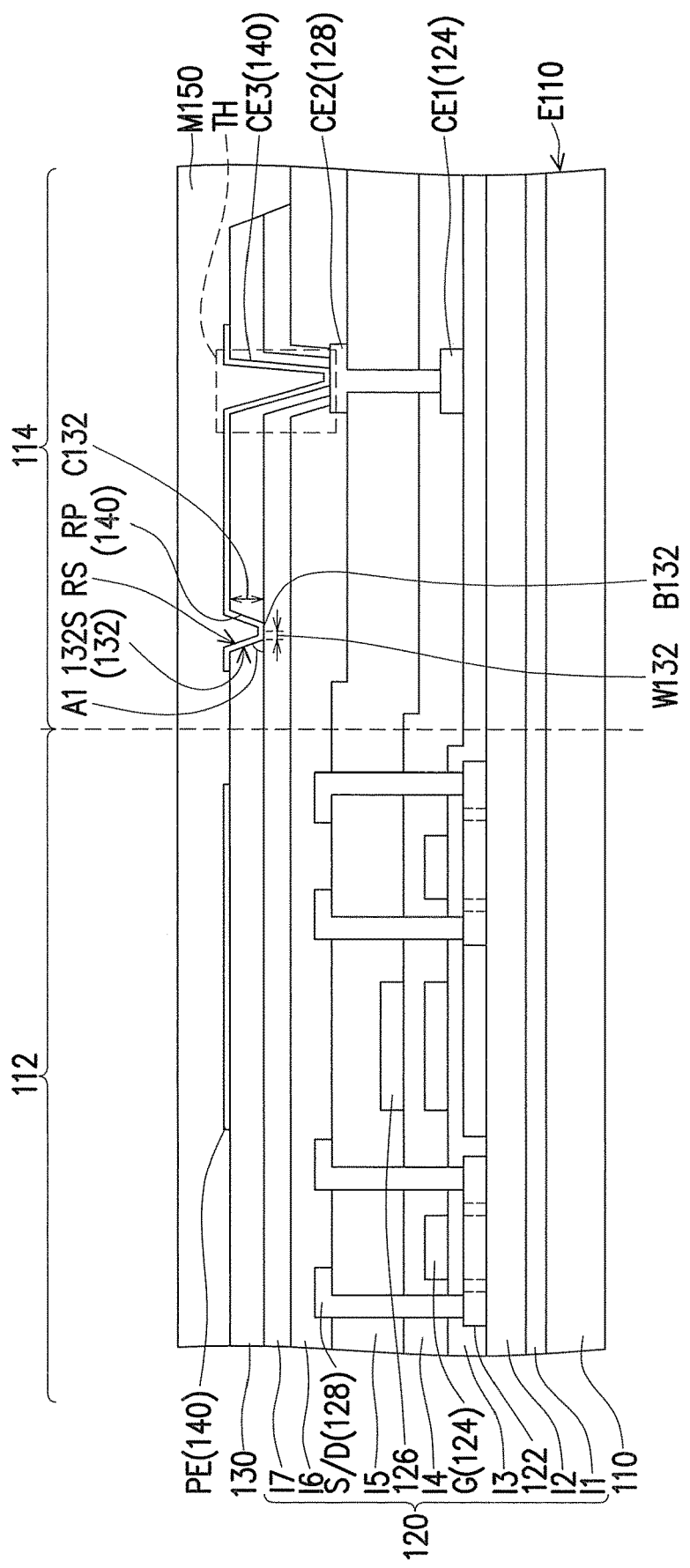
FIGS. 1 to 4 show steps of a fabrication method of an organic light-emitting panel according to an embodiment of the disclosure.

FIGS. 1 to 4 show steps of a fabrication method of an organic light-emitting panel according to an embodiment of the disclosure. In FIG. 1, a substrate 110, and an active element array layer 120, a planarization layer 130, a reflective layer 140, and a photosensitive material layer M150 that have been pre-fabricated on the substrate 110, are provided. The active element array layer 120, the planarization layer 130, the reflective layer 140, and the photosensitive material layer M150 are, for example, formed on the substrate 110 in sequence. The substrate 110 may be a rigid substrate or a flexible substrate, and the material of the substrate 110 includes glass, polymer materials, ceramics, etc. The substrate 110 has a display region 112, and a periphery region 114 beside the display region 112. The periphery region 114 may be closer to an edge E110 of the substrate 110 than the display region 112. In some embodiments, the periphery region 114 may surround the display region 112, and the display region 112 refers to a region that may emit light to provide a luminous effect. When the organic light-emitting panel is applied to a display device, the display region 112 may be understood as a region of a display screen.

The active element array layer 120 includes a semiconductor layer 122, a first metal layer 124, a second metal layer 126, a third metal layer 128, and multiple insulation layers I1-I7. However, in other embodiments, the number of the metal layers and the insulation layers of the active element array layer 120 may be adjusted according to different needs, but not limited thereto. In the embodiment, the insulation layer I1 and the insulation layer I2 are disposed on the substrate 110 in sequence to provide functions such as buffering, isolation, and protection. In some embodiments, other film layers may also be disposed between the insulation layer I1 and the insulation layer I2, such as a metal layer or a light-shielding layer. The semiconductor layer 122 is disposed on the insulation layer I2, and the material of the semiconductor layer 122 includes polysilicon, amorphous silicon, crystalline silicon, an oxide semiconductor, an organic semiconductor, or a combination of the above materials. The insulation layer I3 covers the semiconductor layer 122, so that the semiconductor layer 122 is disposed between the insulation layer I2 and the insulation layer I3.

The first metal layer 124 is disposed on the insulation layer I3, so that the insulation layer I3 is disposed between the first metal layer 124 and the semiconductor layer 122. In some embodiments, the first metal layer 124 may define a gate G in the display region 112, and the orthographic projection of the gate G on the substrate 110 may overlap the orthographic projection of the semiconductor layer 122 on the substrate 110. At this time, the insulation layer I3 located between the gate G and the semiconductor layer 122 may be regarded as a gate insulation layer. In addition, the first metal layer 124 may also define a transmission portion CE1 in the periphery region 114 to provide signal transmission. In other embodiments, the first metal layer 124 may further define other components in the display region 112 and the periphery region 114, such as a capacitor electrode, a scan line, and other transmission lines. The insulation layer I4 covers the first metal layer 124, and the second metal layer 126 is disposed on the insulation layer I4. In some embodiments, the second metal layer 126 may define a transmission line such as a data line in the display region 112, but not limited thereto.

The insulation layer I5 covers the second metal layer 126, and the third metal layer 128 is disposed on the insulation layer I5. The third metal layer 128 defines a source/drain S/D in the display region 112, and the source/drain S/D may penetrate the insulation layer I5, the insulation layer I4 and the insulation layer I3 to be connected to the semiconductor layer 122. Thus, the gate G, the semiconductor layer 122 and the source/drain S/D may constitute an active element, such as a thin film transistor. In addition, the third metal layer 128 may also define a transmission portion CE2 in the periphery region 114, and the transmission portion CE2 may penetrate the insulation layer I5 and the insulation layer I4 to be connected to the transmission portion CE1 of the first metal layer 124, but not limited thereto. In some embodiments, the third metal layer 128 may further include other transmission lines disposed in the display region 112 and the periphery region 114. The insulation layer I6 and the insulation layer I7 are then disposed on the substrate 110 in sequence, and the insulation layer I6 covers the third metal layer 128.

In the embodiment, the respective materials of the insulation layers I1 to I7 may be materials that have insulation, which include silicon oxide, silicon nitride, silicon oxynitride, etc., so as to prevent the metal layers on the upper and lower sides from being electrically connected to each other. In addition, although not shown in the figures, other metal layers may be selectively included between the insulation layer I7 and the insulation layer I6. The material of the first metal layer 124, the second metal layer 126 and the third metal layer 128 may include metal or alloy.

The planarization layer 130 is disposed on the active element array layer 120. The material of the planarization layer 130 includes an organic insulating material. In some embodiments, the planarization layer 130 may be formed on the active element array layer 120 by coating. The planarization layer 130 has, for example, a sufficient thickness to provide a planarization effect. In some embodiments, the flatness of the top surface of the planarization layer 130 away from the substrate 110 may be greater than the flatness of the bottom surface of the planarization layer 130 adjacent to the substrate 110. In addition, the planarization layer 130 has an indentation 132, and the indentation 132 is located in the periphery region 114. A horizontal width W132 of a base B132 of the indentation 132 is, for example, from 4 micrometers (μm) to 12 μm, and a recess depth C132 of the indentation 132 recessed from the top surface of the planarization layer 130 toward the substrate 110 is, for example, from 1 μm to 6 μm, or is, for example, 5.5 μm.

The reflective layer 140 is disposed on the planarization layer 130, and the material of the reflective layer 140 includes a metal with a light reflection effect. In other words, the reflective layer 140 may be a metal reflective layer, which has light reflection properties and conductivity, but not limited thereto. In some embodiments, the reflective layer 140 may be constituted of a laminated structure of a transparent conductive layer, a reflective metal, and a transparent conductive layer. The material of the transparent conductive layer includes a conductive oxide such as indium tin oxide, while the material of the reflective metal includes silver, but not limited thereto. The reflective layer 140 may include a reflective portion RP located in the periphery region 114. The reflective portion RP of the reflective layer 140 is formed along a sidewall 132S of the indentation 132 and defines a reflective taper surface RS. The reflective taper surface RS may be inclined relative to the substrate 110 to provide an oblique reflection effect. In some embodiments, an angle A1 of inclination of the reflective taper surface RS is, for example, from about 50 degrees to 60 degrees, but not limited thereto.

In an embodiment where the reflective layer 140 has conductive properties, the reflective layer 140 may further include a pixel electrode PE located in the display region 112. Although not shown in FIG. 1, the pixel electrode PE may be electrically connected to the source/drain S/D through a through-hole penetrating the planarization layer 130, the insulation layer I7, and the insulation layer I6. In addition, the reflective layer 140 may further include a transmission portion CE3. The transmission portion CE3 is, for example, connected to the reflective portion RP and extends from the reflective portion RP in a direction away from the display region 112. In some embodiments, the transmission portion CE3 may be separated from the reflective portion RP, but not limited thereto. The transmission portion CE3 may be connected to the transmission portion CE2 of the third metal layer 128 through a through-hole TH penetrating the planarization layer 130, the insulation layer I7, and the insulation layer I6. Thus, the transmission portion CE1, the transmission portion CE2, and the transmission portion CE3 may be configured for electrical transmission between the different metal layers. In the embodiment, although the transmission portion CE1, the transmission portion CE2, and the transmission portion CE3 are connected together as an example for illustration, in some embodiments, the connection between the transmission portion CE1, the transmission portion CE2, and the transmission portion CE3 may be adjusted according to different needs. For example, the transmission portion CE2 may be connected to the transmission portion CE3, but not connected to the transmission portion CE1; or, the transmission portion CE2 may be connected to the transmission portion CE1, but not connected to the transmission portion CE3; or, the second metal layer 126 has an additional transmission portion, and at least one of the transmission portion CE1 and the transmission portion CE2 is connected to the additional transmission portion of the second metal layer 126.

The photosensitive material layer M150 is disposed on the substrate 110 and covers the reflective layer 140. The photosensitive material layer M150 is, for example, formed on the substrate 110 by coating. The material of the photosensitive material layer M150 includes an acrylic material, a photoresist material, etc. In some embodiments, the photosensitive material layer M150 may have negative photosensitive properties. Since the photosensitive material layer M150 has fluidity before being solidified, the photosensitive material layer M150 fills uneven structures such as the indentation 132 and the through-hole TH.

Figure 2:
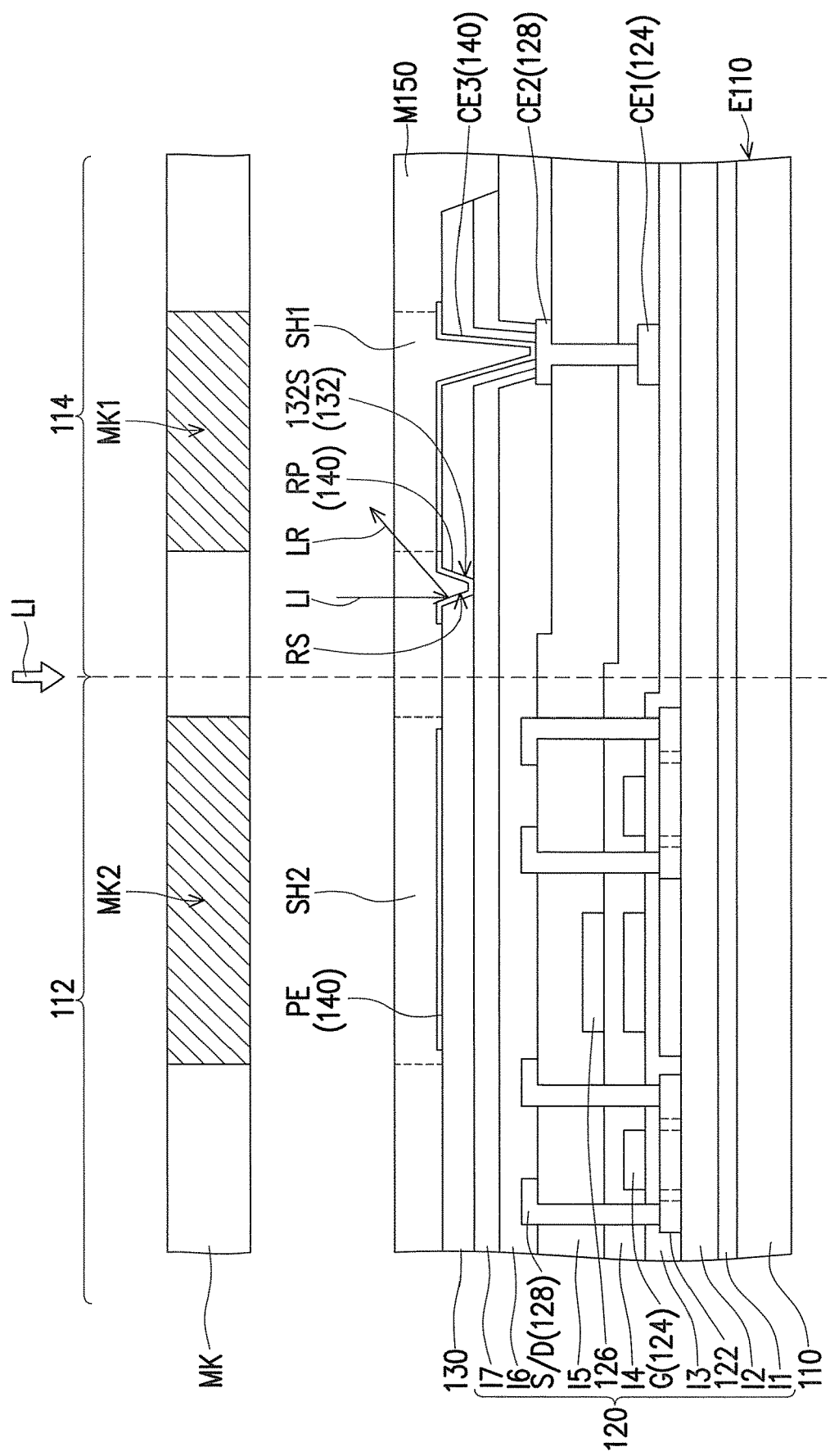

Next, with reference to FIG. 2, a lithography process is performed on the photosensitive material layer M150 using a photomask MK, so as to pattern the photosensitive material layer M150. The photomask MK has a first region MK1 and a second region MK2. The photomask MK has the same light transmittance in the first region MK1 and the second region MK2, and the photomask MK has another light transmittance in a region between the first region MK1 and the second region MK2. Thus, an irradiating light LI used in the lithography process may irradiate a designated region of the photosensitive material layer M150 through the photomask MK, so that the irradiated portion of the photosensitive material layer M150 undergoes photoreaction while other portions do not undergo photoreaction.

In the embodiment, the first region MK1 and the second region MK2 are, for example, light-shielding regions of the photomask MK. Therefore, portions of the photosensitive material layer M150 blocked by the first region MK1 and the second region MK2 are not irradiated by the irradiating light LI, while other portions are irradiated by the irradiating light LI. For example, the first region MK1 of the photomask MK shields a first shielding region SH1 of the photosensitive material layer M150, and the second region MK2 of the photomask MK shields a second shielding region SH2 of the photosensitive material layer M150. The orthographic projection of the first shielding region SH1 on the substrate 110 is, for example, adjacent to but does not overlap the orthographic projection of the indentation 132 on the substrate 110, and the orthographic projection of the second shielding region SH2 on the substrate 110, for example, overlaps the orthographic projection of the pixel electrode PE on the substrate 110, but the disclosure is not limited thereto.

In the embodiment, the reflective portion RP disposed along the sidewall 132S of the indentation 132 may define the reflective taper surface RS, and the indentation 132 is adjacent to the first shielding region SH1 of the photosensitive material layer M150 that is shielded by the first region MK1. Thus, the reflective taper surface RS may reflect the irradiating light LI, and a reflected light LR reflected by the reflective taper surface RS may travel in an oblique direction to irradiate a portion of the first shielding region SH1 adjacent to the indentation 132. In other words, although the portion of the first shielding region SH1 adjacent to the indentation 132 is shielded by the first region MK1, it also undergoes photoreaction.

Figure 3:
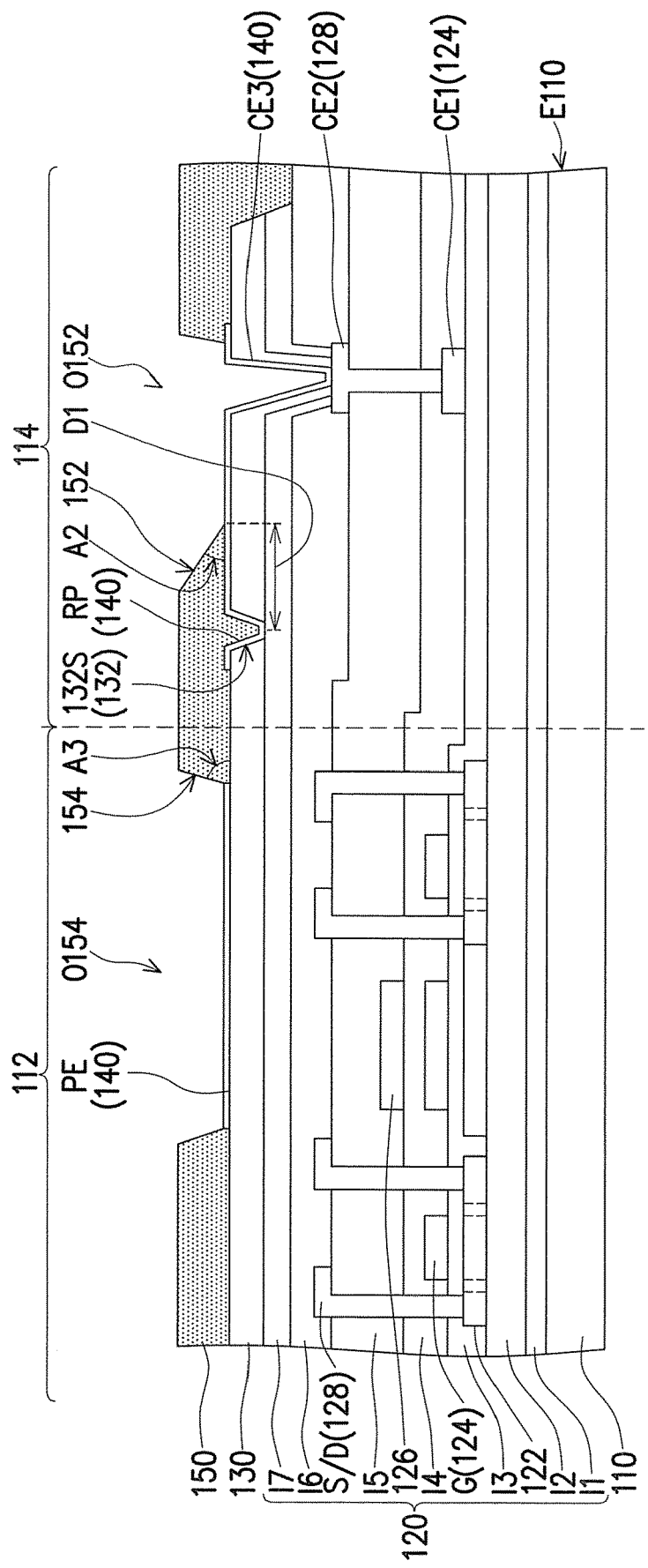

After the irradiation step of FIG. 2, a development step may be performed to pattern the photosensitive material layer M150 into the bank layer 150 shown in FIG. 3. In some embodiments, a solidification step may be performed after the development step, such as heating to make the bank layer 150 more stable. In the embodiment, the photosensitive material layer M150 has, for example, negative photosensitive properties. The irradiated portion of the photosensitive material layer M150 may undergo photoreaction, such as a crosslinking reaction, and a hardening reaction, while the non-irradiated portions may be removed in the development step. Therefore, as shown in FIGS. 2 and 3, the first shielding region SH1 and the second shielding region SH2 in the photosensitive material layer M150, corresponding to the first region MK1 and the second region MK2, are removed.

In the embodiment, the portion of the first shielding region SH1 of the photosensitive material layer M150 adjacent to the indentation 132 may be preserved because it is irradiated by the reflected light LR. However, the portion of the first shielding region SH1 adjacent to the indentation 132 receives a weaker irradiation intensity than other portions directly irradiated by the irradiating light LI. Therefore, the photoreaction intensity of the portion of the first shielding region SH1 adjacent to the indentation 132 is weaker than that of other portions directly irradiated by the irradiating light LI, thereby forming a periphery taper surface 152 in the periphery region 114. In addition, the second shielding region SH2 of the photosensitive material layer M150 is not irradiated by the reflected light LR and may be substantially removed, to form a display region taper surface 154 located in the display region 112.

The indentation 132 in the planarization layer 130 is adjacent to the periphery taper surface 152, is closer to the display region 112 than the periphery taper surface 152, and is covered by the bank layer 150. For example, a horizontal distance D1 from the center of the indentation 132 to a base edge of the periphery taper surface 152 (that is, an edge in contact with the reflective layer 140) may be from 7 μm to 15 μm, such as 9.5 μm, but not limited thereto. Due to the formation of the indentation 132, the periphery taper surface 152 is a structure formed from irradiation by the reflected light LR, and the display region taper surface 154 is a structure formed from direct irradiation by the irradiating light LI. Since the radiation energy provided by the reflected light LR is smaller than the radiation energy provided by the irradiating light LI, the periphery taper surface 152 may be more gradual than the display region taper surface 154. In other words, an angle A2 of inclination of the periphery taper surface 152 is smaller than an angle A3 of inclination of the display region taper surface 154. In some embodiments, the angle A2 of inclination of the periphery taper surface 152 is, for example, from 20 degrees to 60 degrees, and the angle A3 of inclination of the display region taper surface 154 is, for example, greater than 70 degrees, but not limited thereto.

In FIG. 3, the periphery taper surface 152 may surround to form a periphery opening O152, and the transmission portion CE3 of the reflective layer 140 is exposed in the periphery opening O152. In other embodiments, the first shielding region SH1 may extend to an edge of the substrate 110, so that the periphery taper surface 152 is an outline of the bank layer 150. In addition, the display region taper surface 154 may surround to form a pixel region opening O154 in the display region 112, and the pixel electrode PE is exposed in the pixel region opening O154.

Figure 4:
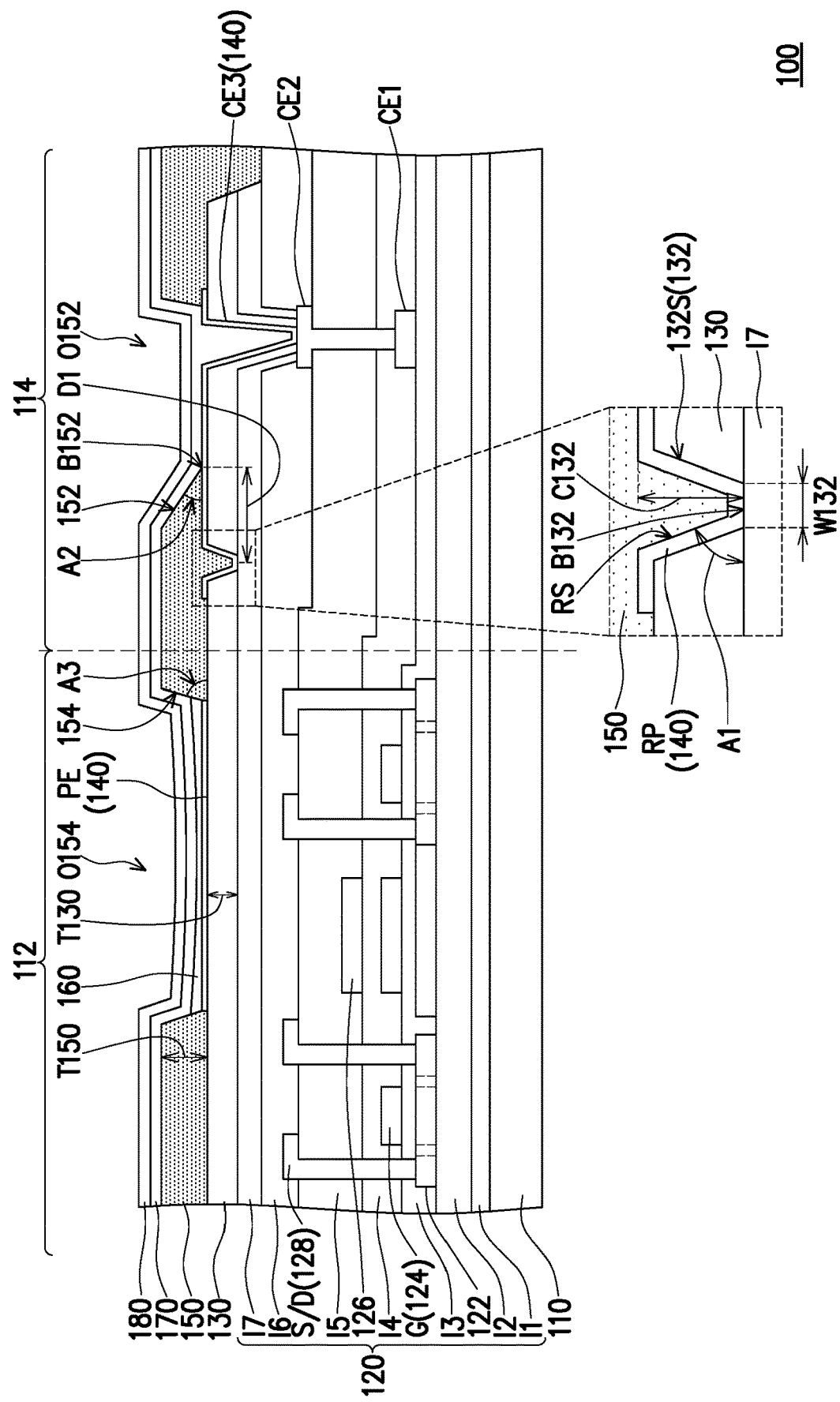

Next, with reference to FIG. 4, in order to fabricate the organic light-emitting panel 100, an organic light-emitting layer 160 may be formed on the substrate 110, and the organic light-emitting layer 160 may be disposed in the pixel region opening O154. In some embodiments, the organic light-emitting layer 160 may be fabricated in the pixel region opening O154 by an inkjet method. For example, an inkjet device may be used to drop a droplet of an organic light-emitting material into the pixel region opening O154, and then the droplet of the organic light-emitting material in the pixel region opening O154 is solidified to form the organic light-emitting layer 160. The droplet of the organic light-emitting material contains a solvent, and therefore the volume of the droplet dropped into the pixel region opening O154 is larger than the volume of the organic light-emitting layer 160 formed after solidifying. Here, the bank layer 150 is configured to restrict the flow or diffusion of the droplet to prevent the droplet in the pixel region opening O154 from mixing with the droplet in an adjacent pixel region opening O154. Therefore, the bank layer 150 may have a certain thickness T150 as needed, such as from 1.5 μm to 3 μm, but not limited thereto.

After the organic light-emitting layer 160 is formed in the pixel region opening O154, an electrode layer 170 and a protective layer 180 may be formed on the substrate 110 in sequence to complete the organic light-emitting panel 100. The material of the electrode layer 170 includes a transparent conductive material, which has conductivity and allows light emitted by the organic light-emitting layer 160 to pass through. The material of the protective layer 180 includes insulating materials. The protective layer 180 may be constituted of inorganic insulating materials such as silicon oxide, silicon nitride, and silicon oxynitride; or constituted of organic insulating materials such as polyimide, epoxy resin, and acrylic; or constituted of a stack of the above organic insulating materials and inorganic insulating materials. The electrode layer 170 may cover the bank layer 150, and cover the organic light-emitting layer 160 that is not covered by the bank layer 150 and the transmission portion CE3 of the reflective layer 140. Thus, the organic light-emitting layer 160 may be disposed between the electrode layer 170 and the pixel electrode PE of the reflective layer 140, and may emit light when driven by the electrode layer 170 and the pixel electrode PE. In addition, the electrode layer 170 may be connected to the transmission portion CE2 and the transmission portion CE1 in the active element array layer 120 through the transmission portion CE3 of the reflective layer 140, and connected to a driving circuit (not shown) through such an electrical transmission path.

In FIG. 4, the organic light-emitting panel 100 includes the substrate 110, the active element array layer 120, the planarization layer 130, the reflective layer 140, the bank layer 150, the organic light-emitting layer 160, the electrode layer 170, and the protective layer 180. The substrate 110 may have the display region 112, and the periphery region 114 located beside the display region 112. The display region 112 may be regarded as the region where light is to be emitted from or an image is to be displayed by the organic light-emitting panel 100, and the periphery region 114 may surround the periphery of the display region 112. The active element array layer 120, the planarization layer 130, the reflective layer 140, the bank layer 150, the organic light-emitting layer 160, the electrode layer 170 and the protective layer 180 are disposed on the substrate 110 in sequence.

The active element array layer 120 is disposed on the substrate 110 and is configured to provide a driving signal to control the light-emitting effect of the organic light-emitting panel 100. Therefore, the organic light-emitting panel 100 of the embodiment is an active light-emitting panel. However, in other embodiments, the organic light-emitting panel 100 may adopt a passive design and the active element array layer 120 may be omitted. The active element array layer 120 may include multiple film layers, and reference may be made to the description of FIG. 1 for its specific structure, which is not reiterated.

The planarization layer 130 is disposed on the substrate 110, and the planarization layer 130 has the indentation 132. The material of the planarization layer 130 may include an organic insulating material. In some embodiments, the planarization layer 130 may be fabricated on the substrate 110 by coating, and the formation of the planarization layer 130 may smooth the uneven structures beneath. In other words, the top surface of the planarization layer 130 away from the substrate 110 may be flatter than the bottom surface close to the substrate 110, but not limited thereto. In some embodiments, the planarization layer 130 and the underlying insulation layer I7 may both provide the planarization effect, and may be integrated into the same layer as needed.

The indentation 132 of the planarization layer 130 is located in the periphery region 114. In FIG. 4, the horizontal width W132 of the base B132 of the indentation 132 is, for example, from 4 μm to 12 μm, and the recess depth C132 of the indentation 132 recessed from the top surface of the planarization layer 130 toward the substrate 110 is, for example, from 1 μm to 6 μm. The recess depth C132 of the indentation 132 recessed from the top surface of the planarization layer 130 toward the substrate 110 may be approximately equal to a thickness T130 of the planarization layer 130, so that the base B132 of the indentation 132 is the insulation layer I7. In other embodiments, the recess depth C132 of the indentation 132 may be smaller than the thickness T130 of the planarization layer 130. That is, the base B132 of the indentation 132 is the planarization layer 130. Alternatively, in some other embodiments, the recess depth C132 of the indentation 132 may be greater than the thickness T130 of the planarization layer 130. That is, the indentation 132 not only penetrates the planarization layer 130, but also goes deeper into the insulation layer I7, and the base B132 of the indentation 132 may be the insulation layer I7.

The reflective layer 140 may include the reflective portion RP, and the transmission portion CE3 that is connected to the reflective portion RP in the periphery region 114. The reflective layer 140 may include the pixel electrode PE in the display region 112. The reflective layer 140 is a film layer having conductive properties and light reflective properties, and it may be constituted of a metal layer or a stacked layer of oxide conductive material, metal, and oxide conductive material. The reflective portion RP of the reflective layer 140 is formed along the sidewall 132S of the indentation 132. Therefore, in a cross-sectional structural view, the reflective portion RP is bent along the indentation 132 to have a U-shaped like structure. The reflective portion RP formed along the sidewall 132S may define the reflective taper surface RS, and the angle A1 of inclination of the reflective taper surface RS is, for example, from about 50 degrees to 60 degrees, but not limited thereto.

The bank layer 150 is disposed on the planarization layer 130. The material of the bank layer 150 includes acrylic, epoxy and other materials that may be patterned by photolithography, and the materials may have negative photosensitive properties before solidifying. Reference may be made to the description of FIGS. 2 and 3 for the specific formation method of the bank layer 150. The bank layer 150 covers the indentation 132, and has the periphery taper surface 152 located in the periphery region 114. The periphery taper surface 152 may surround to form the periphery opening O152, but not limited thereto. At the same time, the indentation 132 of the planarization layer 130 is disposed adjacent to the periphery taper surface 152, and the indentation 132 is closer to the display region 112 than the periphery taper surface 152. In some embodiments, the horizontal distance D1 from the center of the indentation 132 to the base edge B152 of the periphery taper surface 152 is, for example, from 7 μm to 15 μm, but not limited thereto.

In addition, the bank layer 150 also has the display region taper surface 154 in the display region 112. The display region taper surface 154 surrounds to form the pixel region opening O154, and the periphery taper surface 152 is more gradual than the display region taper surface 154. During the patterning process of the bank layer 150, the periphery taper surface 152 and the display region taper surface 154 of different inclinations may be fabricated by the same lithography process, as seen in the foregoing description. Therefore, the fabrication method of the organic light-emitting panel 100 is not complicated by the difference in inclination of the periphery taper surface 152 and the display region taper surface 154.

The organic light-emitting layer 160 is disposed in the pixel region opening O154 and is surrounded by the display region taper surface 154. The organic light-emitting layer 160 may be constituted of a stacked layer of multiple organic material layers. For example, the organic light-emitting layer 160 may include multiple film layers such as a hole injection layer, a hole transport layer, a light-emitting layer, an electron transport layer, and an electron injection layer. The film layers that constitute the organic light-emitting layer 160 may all be formed in the pixel region opening O154 by inkjet, or some of them by inkjet while the others by plating (for example, evaporation or sputtering), or all by plating. In some embodiments, the bank layer 150 may be designed to have the sufficient thickness T150 to avoid spillover or flow of the inkjet droplets during the inkjet process and improve the process yield rate.

The electrode layer 170 may continuously extend from the display region 112 to the periphery region 114 to cover the periphery taper surface 152, and to extend beyond the periphery taper surface 152. In the periphery region 114, the transmission portion CE3 of the reflective layer 140 may extend beyond the periphery taper surface 152 of the bank layer 150, thereby allowing the electrode layer 170 to be connected to the transmission portion CE3. Specifically, the electrode layer 170 may continuously cover the top surface of the bank layer 150, the periphery taper surface 152, and the transmission portion CE3 in the periphery region opening O152. In the embodiment, the periphery taper surface 152 has a gradual angle A2 of inclination, which is, for example, from 20 degrees to 60 degrees. Therefore, even if the bank layer 150 has a thicker thickness T150, it is still not easy for the electrode layer 170 to disconnect on the periphery taper surface 152, which helps to ensure the electrical connection between the electrode layer 170 and the transmission portion CE3, thereby causing the organic light-emitting panel 100 to have good quality.

In the display region 112, the electrode layer 170 then continuously extends from the top surface of the bank layer 150 to the display region taper surface 154, and covers the organic light-emitting layer 160. The organic light-emitting layer 160 is disposed in the pixel region opening O154, which is surrounded to form by the display region taper surface 154. Therefore, the electrode layer 170 only needs to extend on a portion of the display region taper surface 154. Although the angle A3 of inclination of the display region taper surface 154 is larger than the angle A2 of inclination of the periphery taper surface 152, the electrode layer 170 only needs to extend on a portion of the display region taper surface 154, which still reduces the probability of the electrode layer 170 disconnecting on the taper surface. In other words, in the embodiment, the electrode layer 170 is not prone to disconnect regardless of whether it is on the steeper display region taper surface 154 or on the more gradual periphery taper surface 152, and can ensure the fabrication yield rate of the organic light-emitting panel 100.

The protective layer 180 then covers the electrode layer 170 to provide protection and isolation. The material of the protective layer 180 includes insulating materials. The protective layer 180 may be constituted of inorganic insulating materials such as silicon oxide, silicon nitride, and silicon oxynitride; or constituted of organic insulating materials such as polyimide, epoxy resin, and acrylic; or constituted of a stack of the above organic insulating materials and inorganic insulating materials. In some embodiments, the protective layer 180 may obstruct moisture, which helps to prevent the organic light-emitting layer 160 from deteriorating due to invading moisture.

Figure 5:
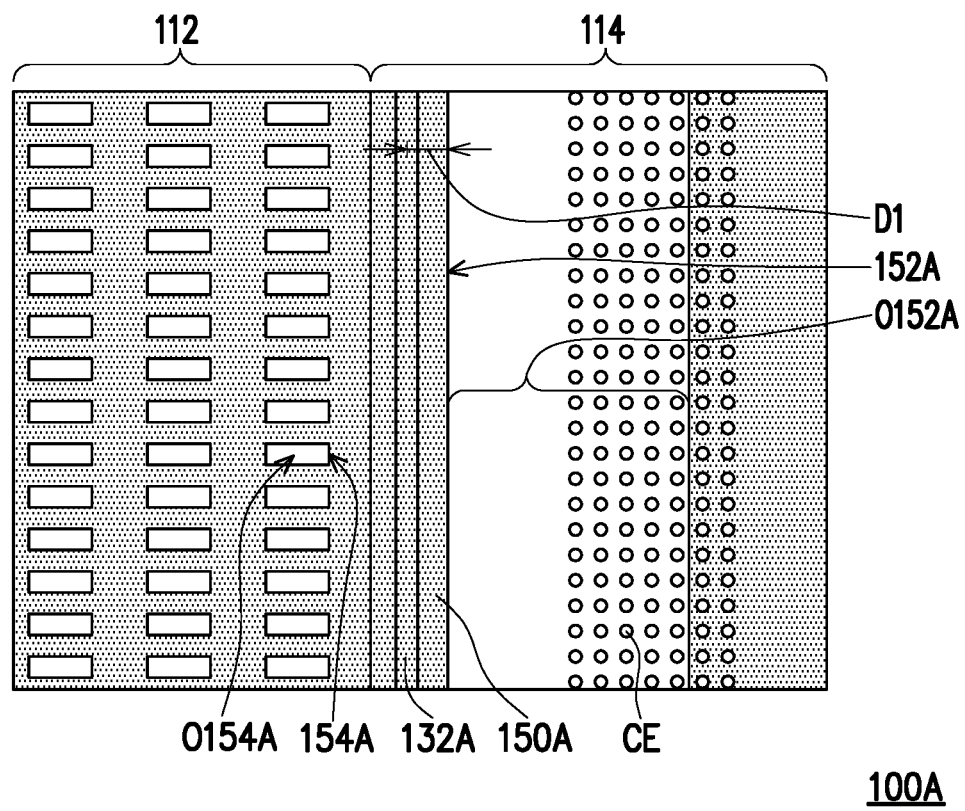
FIGS. 5 to 7 are schematic top views of a partial organic light-emitting panel according to various embodiments of the disclosure.
Figure 6:
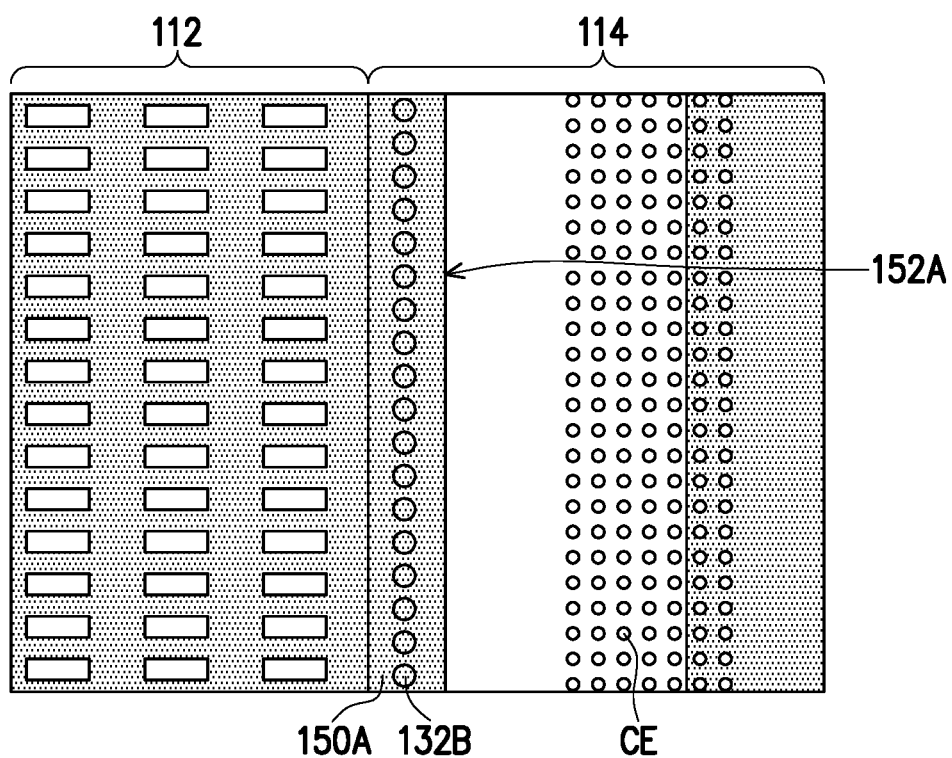
Figure 7:
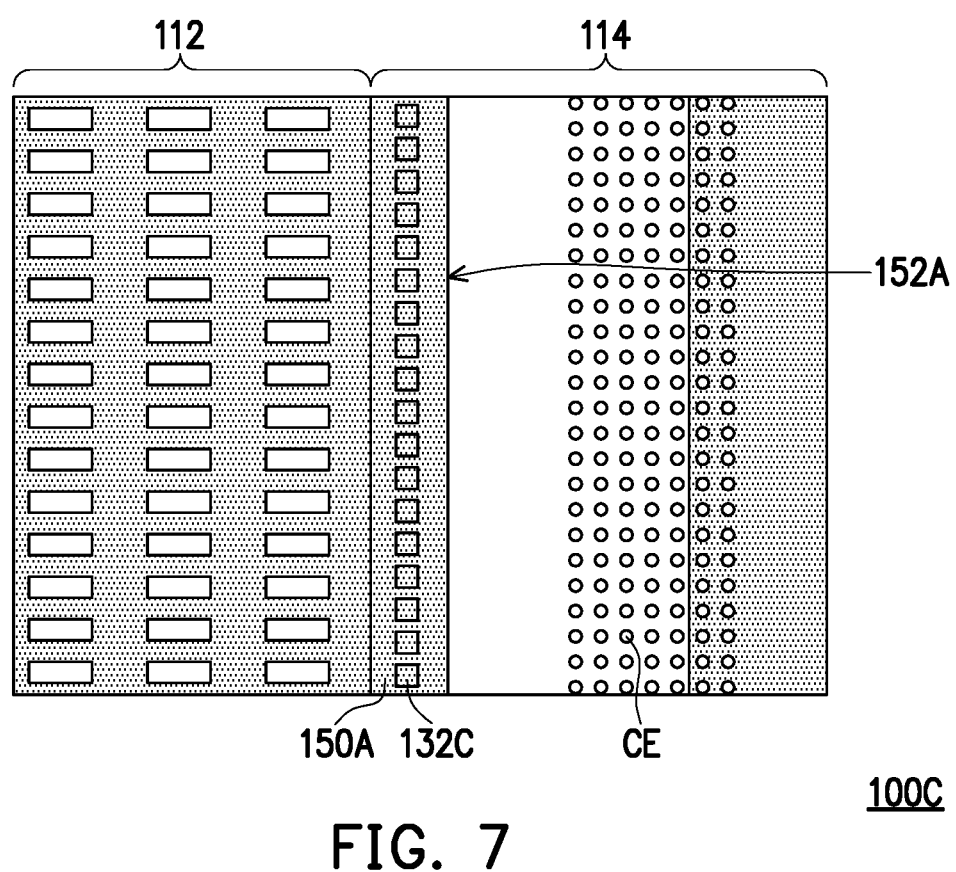

FIGS. 5 to 7 are schematic top views of a partial organic light-emitting panel according to various embodiments of the disclosure. Organic light-emitting panels 100A and 100B in FIGS. 5 to 7 may be regarded as different embodiments of the organic light-emitting panel 100. Some components of the organic light-emitting panel are omitted in FIGS. 5 to 7, and reference may be made to the description of the foregoing embodiment for the omitted components. Specifically, only the indentation, the bank layer, and the transmission structure of the organic light-emitting panel are shown in FIGS. 5 to 7 to clearly present the layout relationship of the components in the top view. In other words, the indentation shown in FIGS. 5 to 7 may be regarded as the top view of a layout of the indentation 132 of the foregoing embodiment, the bank layer shown in FIGS. 5 to 7 may be the top view of a layout of the bank layer 150 of the foregoing embodiment, and the transmission structure shown in FIG. 5 to FIG. 7 may be the top view of a layout of the transmission portions CE1 to CE3 of the foregoing embodiment. In addition, as shown in FIG. 5, FIG. 5 presents an indentation 132A, a bank layer 150A, and a transmission structure CE of the organic light-emitting panel 100A. The bank layer 150A has a periphery region opening O152A surrounded to form by a periphery taper surface 152A, and a pixel region opening O154A surrounded to form by a display region taper surface 154A. The components may be regarded as the top view of a layout of the periphery taper surface 152, the periphery region opening O152, the display region taper surface 154, and the pixel region opening O154 of the foregoing embodiment.

As seen from FIG. 5, the indentation 132A of the organic light-emitting panel 100A is closer to a display region 112 than the periphery taper surface 152A, and the bank layer 150A continuously extends from the display region 112 to a periphery region 114 to cover the indentation 132A. A horizontal distance D1 from the center of the indentation 132A to a base edge (edge) of the periphery taper surface 152A is, for example, from 7 μm to 15 μm. In addition, the indentation 132A may be a long strip-shaped indentation extending along the periphery taper surface 152A. The embodiment of FIG. 6 is similar to FIG. 5, in which FIG. 6 presents indentations 132B, the bank layer 150A, and the transmission structure CE of the organic light-emitting panel 100B. Specifically, the main difference between FIG. 5 and FIG. 6 is that the indentations 132B of FIG. 6 are multiple dot-shaped indentations extending along the periphery taper surface 152A, and are for example, multiple round dot-shaped indentations. The embodiment of FIG. 7 is similar to FIG. 5, in which FIG. 7 presents indentations 132C, the bank layer 150A, and the transmission structure CE of an organic light-emitting panel 100C. Specifically, the main difference between FIG. 5 and FIG. 7 is that the indentations 132C in FIG. 7 are multiple dot-shaped indentations extending along the periphery taper surface 152A, and are for example, multiple square dot-shaped indentations.

In summary, in the organic light-emitting display panel according to the embodiments of the disclosure, the planarization layer has an indentation, the sidewall of the indentation is covered by the reflective layer, and the indentation of the planarization layer is adjacent to the periphery taper surface of the bank layer. In the patterning process of the bank layer, the reflective layer may provide reflection, so that the light reflected by the reflective layer obliquely irradiates the bank layer to form the more gradual periphery taper surface. The design of the periphery taper surface with a gradual slope helps to reduce the probability of subsequent film layers, such as the electrode layer, disconnecting on the periphery taper surface, thereby increasing the yield rate of the organic light-emitting panel, and ensuring the quality of the organic light-emitting panel.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:

1. An organic light-emitting panel, comprising:
   a substrate, having a display region, and a periphery region located beside the display region;
   a planarization layer, disposed on the substrate, and the planarization layer having an indentation;
   a reflective layer, disposed on the planarization layer, wherein the reflective layer is formed along a sidewall of the indentation;
   a bank layer, disposed on the planarization layer, and the bank layer covering the indentation, and having a periphery taper surface located in the periphery region, wherein the indentation is adjacent to the periphery taper surface, and is closer to the display region than the periphery taper surface; and
   an electrode layer, wherein the electrode layer continuously extends from the display region to the periphery region to cover the periphery taper surface and extends beyond the periphery taper surface, and the electrode layer is electrically connected to the reflective layer.

2. The organic light-emitting panel according to claim 1, wherein the bank layer further has a display region taper surface located in the display region, the display region taper surface surrounds to form a pixel region opening, and the periphery taper surface is more gradual than the display region taper surface.

3. The organic light-emitting panel according to claim 2, further comprising an organic light-emitting layer, which is disposed in the pixel region opening, and surrounded by the display region taper surface.

4. The organic light-emitting panel according to claim 1, wherein an angle of inclination of the periphery taper surface is from 20 degrees to 60 degrees.

5. The organic light-emitting panel according to claim 1, wherein a horizontal distance from a center of the indentation to a base edge of the periphery taper surface is from 7 μm to 15 μm.

6. The organic light-emitting panel according to claim 1, wherein a recess depth of the indentation recessed from a top surface of the planarization layer toward the substrate is from 1 μm to 6 μm.

7. The organic light-emitting panel according to claim 1, wherein the indentation comprises a plurality of dot-shaped indentations distributed along the periphery taper surface or a long strip-shaped indentation distributed along the periphery taper surface.

8. The organic light-emitting panel according to claim 1, wherein a horizontal width of a base of the indentation is from 4 μm to 12 μm.

9. The organic light-emitting panel according to claim 1, wherein the reflective layer comprises a metal reflective layer.

10. The organic light-emitting panel according to claim 1, wherein the reflective layer comprises a reflective portion, and a transmission portion connected to the reflective portion, the reflective portion covers the indentation, and the transmission portion extends beyond the periphery taper surface to allow the electrode layer to be connected to the transmission portion.

* * * * *